(12) United States Patent
Weaver et al.

(10) Patent No.: US 7,470,553 B1
(45) Date of Patent: Dec. 30, 2008

(54) BUILT-IN DESIGN EDIT STRUCTURES

(75) Inventors: Kevin Weaver, San Jose, CA (US);
Zachary J. Gemmill, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 292 days.

(21) Appl. No.: 11/128,409

(22) Filed: May 12, 2005

(51) Int. Cl.
*H01L 21/00* (2006.01)

(52) U.S. Cl. .......................... 438/4; 438/637; 438/675; 257/E21.577

(58) Field of Classification Search ............... 438/4, 438/637, 675; 257/E21.577
See application file for complete search history.

(56) References Cited

U.S. PATENT DOCUMENTS 6,670,717 B2 * 12/2003 Kane et al. .................. 257/774

* cited by examiner

*Primary Examiner*—Chandra Chaudhari
(74) *Attorney, Agent, or Firm*—Jurgen Vollrath

(57) ABSTRACT

In an IC structure and method for debugging or adjusting the parameters of an IC circuitry, edit structures are formed in the IC device and are connected to desired portions of the IC circuitry buy forming vias through the passivation layer overlying the top metal layer and forming metal interconnects.

11 Claims, 2 Drawing Sheets

BUILT-IN DESIGN EDIT STRUCTURES

FIELD OF THE INVENTION

The invention relates to semiconductor fabrication. In particular it relates to the debugging of integrated circuits through the connection of device edit structures of known value.

BACKGROUND OF THE INVENTION

In forming integrated circuits (ICs), it is often necessary to adjust the parameters such as the resistance or capacitance of specific portions of the circuitry of the IC. This is achieved by making use of edit structures, e.g. resistors, capacitors, diodes or transistors, that have a know value and size and are electrically connected to selected portions of the circuitry. These edit structures are ad hoc devices that are secured to the IC, whereafter vias are etched down into the circuitry to the desired location to make metal contact with the structures of the circuitry. Unfortunately this requires milling into the lower circuit layers and often requires that the metal be rerouted several times. Furthermore, in order to achieve the desired parameter change to the requisite level of accuracy, the editing steps often involve several iterations which is not only time consuming but can destroy the device for future analysis.

SUMMARY OF THE INVENTION

According to the invention there is provided a method for debugging an integrated circuit (IC) circuitry by forming at least one device edit structure into the IC structure during fabrication of the IC structure. Typically the device edit structure will have a pre-defined value and preferably will have a pre-defined size and pre-defined placement. In one embodiment, the method is for the debug phase of first silicon and the edit structures are accessed by forming vias through a passivation layer to top metal layer connections of the edit structures. The vias may be formed by making use of a focused ion beam (FIB). FIBs may be used for milling openings in the passivation layer and for depositing interconnecting metal. Although the invention is not limited to specific ion beams, in one embodiment XeF2 was used for milling openings into the passivation layer, and W was used for depositing metal. In another embodiment Pt was used for depositing metal.

Further, according to the invention, there is provided an IC structure comprising integrated circuit (IC) circuitry and at least one edit structure, wherein the edit structure is built into the integrated circuit structure during IC circuitry fabrication. The edit structure may be electrically connected to the IC circuitry by means of vias extending through a passivation layer to a top metal layer of the IC structure, and by metal interconnects. The vias and metal interconnects may be formed using focused ion beams (FIBs).

Still further, according to the invention, there is provided a method of adjusting the resistive or capacitive values of one or more portions of an integrated circuit (IC) circuitry, comprising forming one or more edit structures as part of the fabrication of the IC circuitry, and connecting one or more of the edit structures to desired areas of the IC circuitry. Preferably the connecting is done by forming vias through a passivation layer overlying a top metal layer of the integrated circuit, and providing metal interconnects to the desired areas of the IC circuitry. The vias and metal interconnects may be formed using focused ion beams (FIBs). The forming of the vias may include milling openings in the passivation layer using a FIB and then filling the opening with metal using a FIB. The milling may be done using XeF2, and the filling may be done using a tungsten (W) or platinum (Pt) FIB.

DETAILED DESCRIPTION OF THE INVENTION

Figure 1:
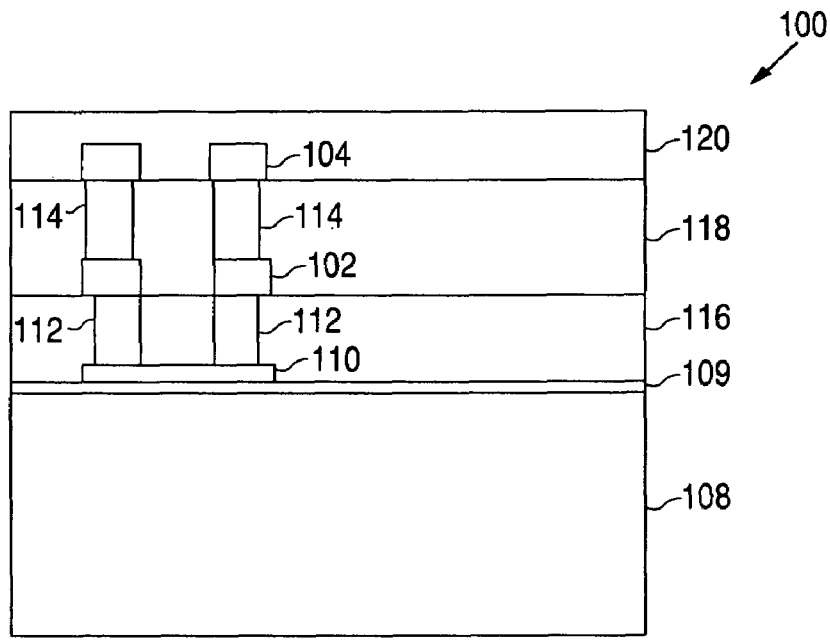
FIGS. 1-3 show cross-sectional views of an integrated circuit (IC) structure having an isolated poly resistor edit structure, at various stages of interconnection to IC circuitry.

FIG. 1 shows a section through an integrated circuit (IC) structure 100 formed by a two layer metal process and therefore including a first metal layer 102 and a second metal layer 104, which is the top metal layer in this IC structure. An isolated polysilicon resistor 110 is provided as an edit structure and is connected to first metal 102 by via connections 112, and to second metal 104 by via connections 114. In accordance with the invention, the resistor 110 is formed as part of the process of forming the integrated circuit circuitry (not shown) of the structure 100. Thus the first metal layer 102 and second metal layer 103 are the metal layers of the IC circuitry and are formed according to methods commonly known in the art. The resistor 102 is isolated from the silicon substrate 108 of the structure 100 by means of a SiO2 isolation layer 109. As shown in FIG. 1 a SiO2 layer 116 is formed over the poly resistor 102, and a SiO2 layer 118 is formed over the first metal layer 104. A passivation layer 120 is, in turn, formed over the second metal layer 104, as shown in FIG. 1.

Figure 2:
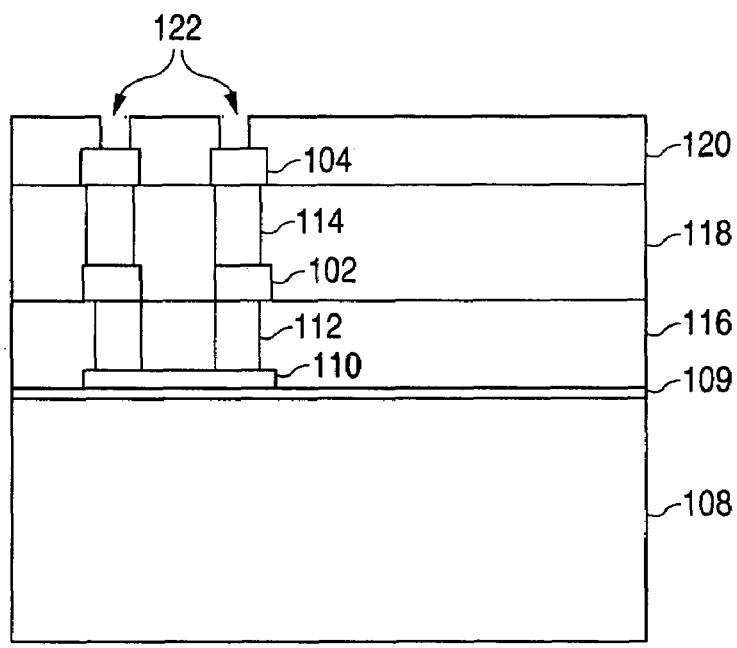

In order to provide electrical contact between the resistor 110 and desired portions of the IC circuitry, a preferred embodiment of the invention makes use of vias through the passivation layer 120 that is formed on top of the top metal layer 104, as shown in FIG. 2. Openings or holes 122 are milled into the passivation layer 102 using a focused ion beam (FIB). For example, a XeF2 ion beam can be used to cut through the passivation layer 120.

Figure 3:
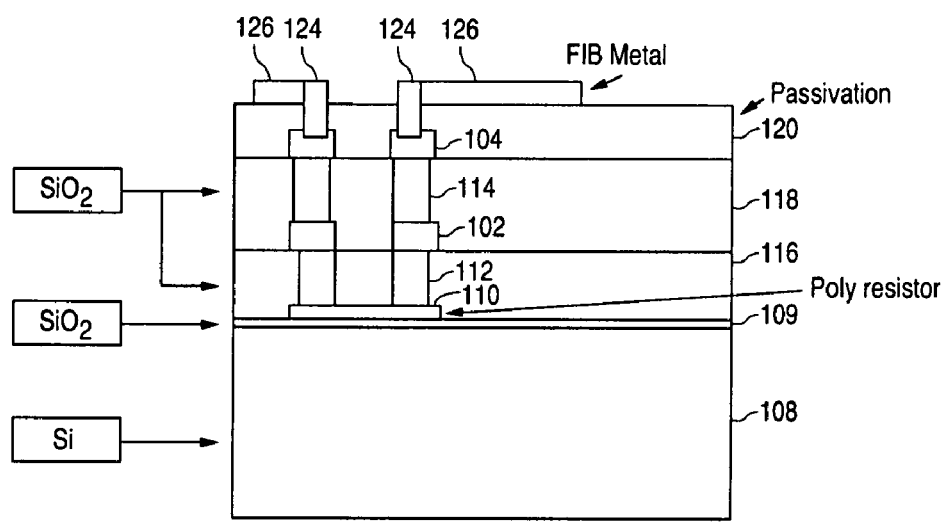

Thereafter, metal is deposited in the holes 122 to define vias 124, and metal interconnects 126 are formed extending horizontally from the vias 124, as shown in FIG. 3. In one embodiment a FIB process was used to deposit the metal for the vias 124 and interconnects 126. For example, tungsten (W) or platinum (Pt) can be used as the ion in the FIB process when the metal is deposited.

Thus it will be appreciated that the edit structures in the present invention, such as the resistor 110 included in the IC structure during the fabrication process but are initially isolated from the rest of the circuitry. Thereafter the interconnection to the IC circuitry is achieved by simply having to expose the top metal by milling away the passivation layer overlying the top metal. Thus there is no need to mill into the lower circuit layers as is the case in the prior art edit structures that are attached ad hoc to the surface of the IC device. The present invention therefore also avoids having to deal with the problem of re-routing metal through the lower circuit layers which are compounded when several editing iterations have to be performed to achieve the desired characteristics, e.g, to adjust the resistance and capacitance values to achieve the desired delay in a signal path.

While the above embodiment made use of a FIB process to mill away the passivation layer and to deposit the metal for the vias 124 and interconnects 126, it will be appreciated that the vias and interconnects could be formed using other process steps. It will also be appreciated that while an isolated resistor was shown in the discussed embodiment, the edit structure could be any other edit structure such as a capacitors, diodes, transistors, etc.

What is claimed is:

1. A method of debugging an integrated circuit (IC) circuitry formed in an IC structure having a top metal layer, comprising
forming at least one device edit structure into the IC structure during fabrication of the IC structure, wherein the device edit structure is isolated from the IC circuitry by at least one isolation layer,
forming a passivation layer over the top metal layer, and
connecting the device edit structure to the IC circuitry by means of vias extending through the passivation layer and by means of laterally extending metal interconnects extending from the vias along the passivation layer.

2. A method of claim 1, wherein the device edit structure has a predefined value.

3. A method of claim 2, wherein the device edit structure has a predefined size and pre-defined placement.

4. A method of claim 1, wherein the device edit structure is accessed by forming vias through the passivation layer to top metal layer connections of the edit structure.

5. A method of claim 4, wherein the vias are formed by making use of a focused ion beam (FIB).

6. A method of claim 5, wherein XeF2 is used for milling openings into the passivation layer, and W (tungsten) or Pt (platinum) is used for depositing metal.

7. A method of adjusting the resistive or capacitive values of one or more portions of an integrated circuit (IC) circuitry, comprising
forming one or more edit structures as part of the fabrication of the IC circuitry, and
connecting one or more of the edit structures to desired areas of the IC circuitry by means of vertically extending vias and horizontally extending metal interconnects.

8. A method of claim 7, wherein the connecting is done by forming vias through a passivation layer overlaying a top metal layer of the IC circuitry, and providing metal interconnects on the passivation layer extending to above the desired areas of the IC circuitry.

9. A method of claim 8, wherein the vias and metal interconnects are formed using focused ion beams (FIBs).

10. A method of claim 9, wherein the forming of the vias includes milling openings in the passivation layer using a FIB and then filling the opening with metal using a FIB.

11. A method of claim 10, wherein the milling is done using XeF2, and the filling is done using a tungsten (W) or platinum (Pt) FIB.

* * * * *